United States Patent
Horman et al.

(10) Patent No.: US 8,717,032 B2
(45) Date of Patent: May 6, 2014

(54) ELECTRONIC CIRCUIT BREAKER AND A METHOD OF PROVIDING PROTECTION SWITCHING

(75) Inventors: Johan Horman, Bromma (SE); Hans Kramer, Nynashamn (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 257 days.

(21) Appl. No.: 13/145,634

(22) PCT Filed: Jan. 28, 2009

(86) PCT No.: PCT/SE2009/050086
§ 371 (c)(1),
(2), (4) Date: Jul. 21, 2011

(87) PCT Pub. No.: WO2010/087745
PCT Pub. Date: Aug. 5, 2010

(65) Prior Publication Data
US 2011/0279985 A1    Nov. 17, 2011

(51) Int. Cl.
*G01R 31/02* (2006.01)
(52) U.S. Cl.
USPC ........... 324/424; 324/525; 323/282; 323/351; 361/100; 361/101; 361/93.2; 361/93.7; 361/93.9
(58) Field of Classification Search
USPC ................. 324/415, 416, 424, 525, 768, 771; 323/224, 282, 351; 361/100, 101, 93.2, 361/93.7, 93.9, 435
See application file for complete search history.

(56) References Cited

U.S. PATENT DOCUMENTS

| | | | |
|---|---|---|---|
| 4,949,211 A | 8/1990 | Edwards | |
| 5,153,809 A | 10/1992 | Murakami | |
| 5,543,997 A * | 8/1996 | Ruprecht | 361/100 |
| 5,763,963 A * | 6/1998 | Zydek et al. | 307/130 |
| 5,828,540 A * | 10/1998 | Marmonier et al. | 361/195 |
| 5,942,886 A | 8/1999 | Kelly | |
| 6,233,128 B1 * | 5/2001 | Spencer et al. | 361/86 |
| 6,262,871 B1 * | 7/2001 | Nemir et al. | 361/42 |
| 6,603,326 B1 * | 8/2003 | Tse et al. | 324/762.01 |
| 2003/0030954 A1 * | 2/2003 | Bax et al. | 361/87 |
| 2003/0052543 A1 * | 3/2003 | Boost | 307/42 |
| 2003/0063419 A1 * | 4/2003 | Nemir et al. | 361/78 |
| 2004/0012393 A1 * | 1/2004 | Schmalz et al. | 324/424 |
| 2005/0030684 A1 * | 2/2005 | Brandonisio | 361/42 |
| 2008/0002325 A1 * | 1/2008 | Kato et al. | 361/101 |

FOREIGN PATENT DOCUMENTS

JP    2005318791 A    11/2005

\* cited by examiner

*Primary Examiner* — Patrick J Assouad
*Assistant Examiner* — Alexander J Nemtzow
(74) *Attorney, Agent, or Firm* — Rothwell, Figg, Ernst & Manbeck, P.C.

(57) ABSTRACT

A protection switching system in a power supply distribution system, comprises at least one protection switch (25) comprising a controllable semiconductor arranged to conduct current through the power supply line in a normal mode, a control unit (27) arranged to place the at least one protection switch in a test mode in which the current is reduced compared to the normal mode, registration means (28, 29) for registering a test mode value of at least one electrical characteristic in the power supply line that will be affected when the test mode is applied, a monitoring unit (30; 47) arranged to evaluate the at least one electrical characteristic and determine, based on the evaluation, whether or not an action should be taken. If a malfunction is detected an alarm is issued to indicate to service personnel that the protection switch should be replaced.

13 Claims, 6 Drawing Sheets

Control signal

Output signal

Control signal

Output signal

ELECTRONIC CIRCUIT BREAKER AND A METHOD OF PROVIDING PROTECTION SWITCHING

CROSS-REFERENCE TO RELATED APPLICATION

This application is a 35 U.S.C. §371 National Phase Entry Application from PCT/SE2009/050086, filed Jan. 28, 2009, and designating the United States.

TECHNICAL FIELD

The present invention relates to protection switching and more specifically to a circuit breaker that may be used for protection switching and a method for providing protection switching using such a circuit breaker.

BACKGROUND AND RELATED ART

The infrastructure requirements on telecommunications systems regarding availability are very high compared to other comparable systems. As the traffic through communications network Internet and other communications systems increases the power consumption increases. This increases the risk of, and the consequences of, a power failure.

It is common in the art to use fuses or protection switches to limit the damage caused by a power failure.

For example, the power supply to the electronic components is provided with fuses. For this purpose electromagnetic fuses are often used, because they are very reliable On the other hand, they are not optimal when the power consumption increases because of the transients caused by non-accurate tripping.

Electronic circuit breakers have the advantage that it is easier to avoid transients when breaking the current. Attempts to use electronic circuit breakers for protection switching of the power supplies in communication systems have been unsuccessful because they are not reliable enough.

As an example, the maximum acceptable failure rate $\lambda$ at 44 A for the failure mode "short-circuit" is specified to 5 nF/h, where F/h is the acceptable number of failures per hour. This means that a maximum of $5 \times 10^{-9}$ errors may occur per hour or, the other way around, that $2 \times 10^8$ hours should pass between errors. State of the art commercial semiconductors do not meet this rigorous reliability requirement. The failure rate for a single MOSFET is in the range of 20 nF/h. This means that a MOSFET has a far too high failure rate to be acceptable in applications having very high availability requirements.

SUMMARY OF THE INVENTION

It is an object to provide an electronic circuit breaker that can be used for protection switching enabling a very high degree of reliability, and a method for providing protection switching.

The invention relates to an electronic circuit breaker for use in a power supply distribution system, comprising
- at least one protection switch arranged to conduct current through the power supply line in a normal mode,
- a control unit arranged to control the at least one protection switch to enter a test mode in which the current through the at least one protection switch is reduced compared to the normal mode,
- registration means for registering at least one electrical characteristic in the power supply line that will be affected when the test mode is applied,
- a monitoring unit arranged to evaluate the at least one electrical characteristic and determine, based on the evaluation, whether or not an action should be taken.

The invention also relates to a method for providing protection switching in a power supply line having at least one protection switch arranged in it, the at least one protection switch being arranged to conduct current through the power supply line in a normal mode. The method comprises the following steps:
- controlling the at least one protection switch to enter a test mode in which the current through the at least one protection switch is reduced compared to the normal mode,
- registering in test mode at least one electrical characteristic in the power supply line that will be affected when the test mode is applied,
- evaluate the at least one electrical characteristic and determine, based on the evaluation, whether or not an action should be taken.

Because of the failure supervision provided by the registration means and the monitoring unit, service personnel may be notified if a circuit breaker is malfunctioning. Therefore, the faulty device can replaced within a short time. Alternatively, an automatic measure may be taken, for example switching to a redundant system. The replacement of a faulty device shortly after the failure occurs reduces demands on the reliability of the device itself. Therefore, the invention enables the use of electronic circuit breakers for protection switching, by compensating for the higher failure rate of such components by enabling a prompt replacement of the circuit breaker in the case of failure. The use of electronic circuit breakers in turn enables a more efficient use of the electric circuit boards, since when the transients are reduced or eliminated the circuitry that is commonly needed on the boards to compensate for the transients can be eliminated.

The circuit breaker and method according to the invention may be used in a wide range of applications. For example, in communications systems the inventive principle may be applied in the power cabinet itself, on the power supply distribution to the electronic components. It may also be applied as a fuse on an individual printed board assembly.

The at least one protection switch comprises a controllable semiconductor, preferably a transistor. The nature and dimension of the controllable semiconductor may be determined in dependence of the application for which it is to be used. For applications up to approximately 500-600 V and 100 A, a suitable controllable semiconductor will be a Field Effect Transistor (FET). In high-voltage applications, other types of components may be more feasible. A suitable choice for the controllable semiconductor in this case will be a thyristor.

The electronic circuit breaker preferably further comprises an alarm unit arranged to receive information from the monitoring unit regarding the value of the electrical characteristic while in test mode. In this way service personnel can be informed about a failure in an efficient manner.

In one preferred embodiment the monitoring unit is arranged to evaluate the at least one electrical characteristic by comparing it to a threshold value. The threshold value should be selected in such a way that the value in normal mode will never exceed the threshold value and that the value in test mode will exceed the threshold value within a relatively short time so that a failure can be detected within a short monitoring time.

Alternatively, the monitoring unit is arranged to evaluate the at least one electrical characteristic by first storing a first value for the electrical characteristic obtained in normal mode, then storing a second value for the electrical characteristic obtained in test mode and comparing the first and second value.

In a preferred embodiment the registration means includes at least one resistor and a voltage meter for measuring the voltage across the resistor. Alternatively, or in addition to the voltage meter, the registration means may include an ampere meter for measuring the current through the power supply line. The voltage and the current are electrical characteristics that are easy to measure in a number of known ways.

An electronic circuit breaker module may comprise two or more branches, each branch comprising an electronic circuit breaker according to the above. In this case, the control means is arranged to control the electronic circuit breaker of each branch and the registration means is arranged to measure the electrical characteristic for each of the branches. If the electrical characteristic is the current this involves measuring the current in each branch separately. If the electrical characteristic is the voltage, it may be measured using one voltage meter connected in parallel with the branches.

If two or more branches are used, the control means is preferably arranged to place the electronic circuit breakers in test mode at different times. The branches may be tested one by one or, if there are several branches, in groups of two or more.

The invention also relates to a telecommunications system having a power supply including at lest one rectifier arranged to provide a DC voltage to a number of printed board assembly and including protection switch comprising an electronic circuit breaker according to the above. In such a configuration The invention also relates to a printed board assembly comprising a printed circuit board having a power input and a number of electrical components thereon, and comprising an electronic circuit breaker according to the above arranged to function as a protection switch on the power input to the printed board assembly.

BRIEF DESCRIPTION OF THE DRAWINGS

Embodiments of the invention will be described in more detail in the following, with reference to the appended drawings, in which.

DETAILED DESCRIPTION OF EMBODIMENTS

Figure 1:
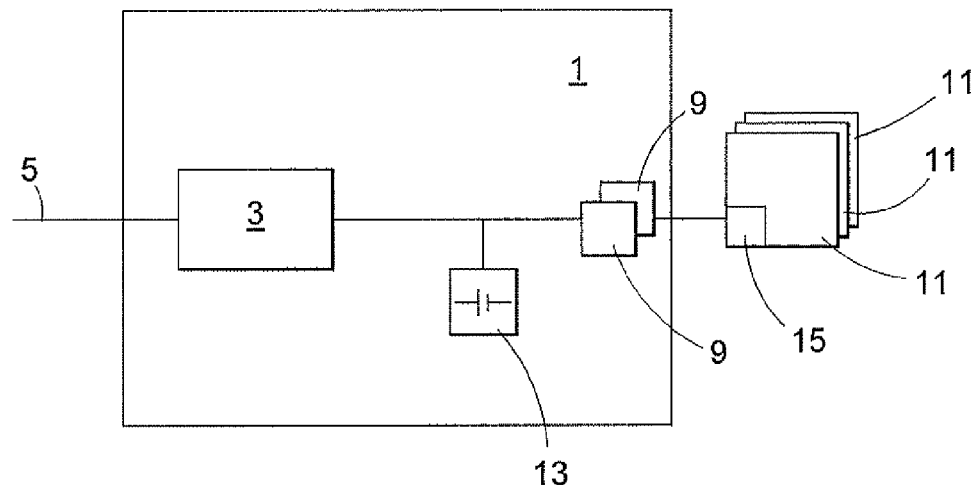
FIG. 1 shows, schematically, a telecom system in which the inventive idea may be applied

FIG. 1 illustrates schematically a telecom system in which the inventive idea may be applied. The system comprises a power supply 1 having at least one AC/DC rectifier 3 connected to the mains power supply 5. The rectifier 3 converts the incoming AC voltage to a DC voltage which is supplied to a number of protection switches, or fuses 9 arranged to protect a number of printed board assemblies 11, typically boards performing telecommunications functions. The printed board assemblies 11 are typically arranged in shelves in a cabinet (not shown), connected to backplanes arranged in the cabinet. Between the rectifier 3 and the protection switches 9 a battery 13 is connected. Each printed board assembly 11 has a protection function 15 on its input. According to the invention the protection switches 9 and or the protection functions 15 are arranged to perform self-tests by means of a monitoring unit and/or a control unit as will be discussed in more detail in the following.

The inventive idea, which will be discussed in more detail in the following, may be used in the protection switches 9 connecting the power supply to the cabinet of printed board assemblies. It may also be used for the protection function 15 arranged on each of the boards.

Figure 2:
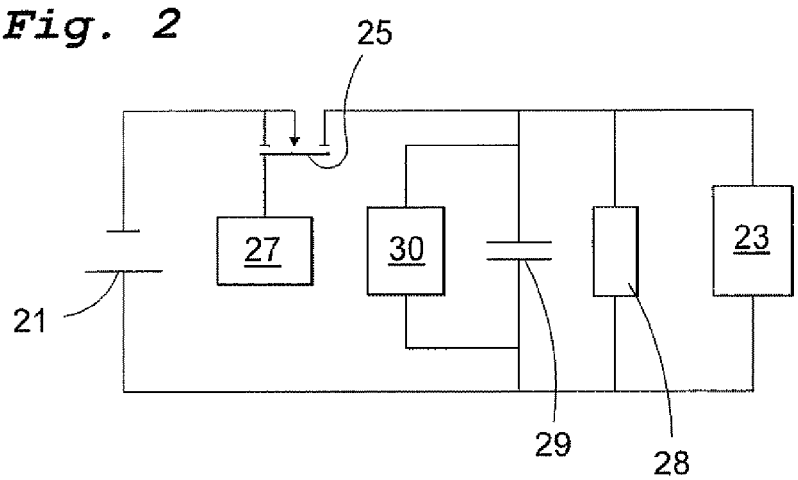
FIG. 2 shows a basic implementation of a circuit breaker according to an embodiment the invention

A basic embodiment of the invention is shown in FIG. 2. A power supply 21 is arranged to provide a voltage to a load 23. A protection switch 25 is arranged between the power supply and the load. The protection switch is arranged to monitor the current provided by the power supply. If an error occurs which causes the current to increase above acceptable levels, the protection switch is arranged to limit the current. Therefore, reliable function of the protection switch is essential to avoid damaging the load should an error occur.

The protection switch 25 is implemented as a controllable semiconductor. In a preferred embodiment the protection switch is a transistor, such as a field effect transistor or a bipolar transistor. A control unit 27 is arranged to control the protection switch. In a normal mode of the protection switch is open so that a current can flow from the power supply to the load. The control unit 27 is arranged to place the protection switch 25 in a test mode in which the conducting capacity is reduced. For example, if the protection switch is a field effect transistor, the gate voltage of the transistor may be controlled in such a way that the conducting capacity of the transistor is reduced.

When the protection switch is in the test mode, the voltage across the load should drop. In the example of a transistor, if the transistor is short circuited, it will continue to conduct even though it is placed in test mode. In this case there will be no voltage drop. To measure the voltage a resistor 28 and a capacitor 29 are connected in parallel with each other and with the load 23. The voltage is measured across the resistor. If the current flowing through the transistor is reduced the voltage across the resistor 28 will drop. Therefore, the voltage across the resistor 28 is an indicator of the function of the transistor 25. A monitoring unit 30 is arranged to monitor the voltage across the resistor 28 and compare it to a threshold value. If the voltage drops to a certain threshold level this indicates that the switch is functioning correctly. If the voltage does not drop sufficiently this indicates that the switch is malfunctioning. Therefore, if the voltage does not reach the threshold level, the monitoring unit 30 is arranged to issue an alarm, to indicate that the switch should be replaced.

The capacitor 29 is arranged to provide a current to the load 23 when the current flowing to the transistor 25 is interrupted. In some cases this current supply is not needed and the capacitor can be omitted.

Figure 3A:
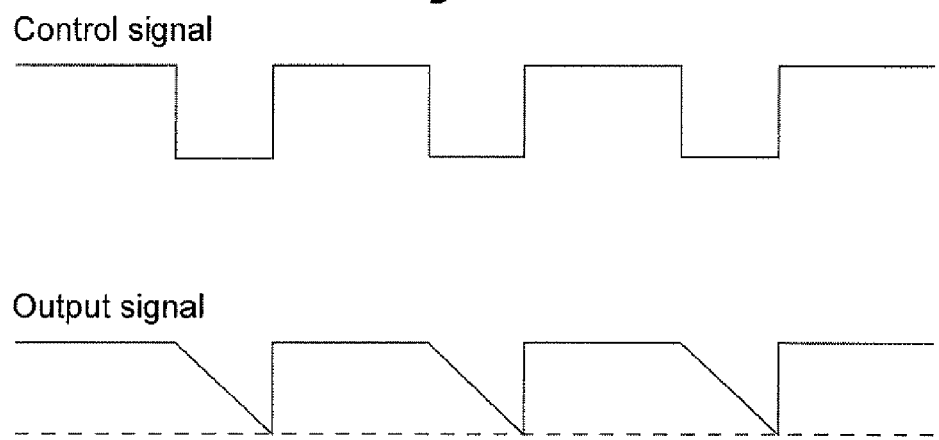
FIGS. 3a and 3b illustrate the function of a circuit breaker according to an embodiment of the invention
Figure 3B:
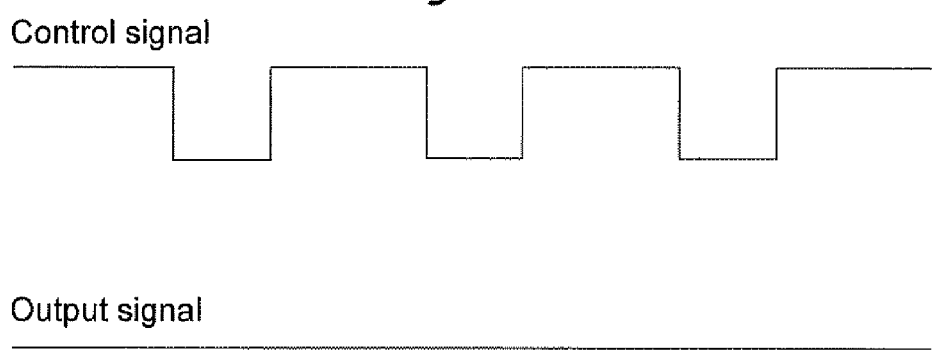

FIGS. 3a and 3b illustrate schematically the control voltage on the transistor's 25 gate and the resulting voltage across the resistor 28. The uppermost curve in each figure represents the gate control voltage applied to the transistor and the lowermost curve represents the resulting voltage across the resistor 28. As can be seen, the control voltage is reduced at certain points, to apply the test mode to test the function of the transistor 25. In FIG. 3a the reduced control voltage results in a reduced voltage across the resistor 28. When the voltage across the resistor reaches a threshold level T the monitoring unit concludes that the transistor 25 is not conducting and is therefore functioning as a circuit breaker. In FIG. 3b the voltage level across the resistor 28 remains constant even when the transistor is in test mode. The monitoring unit should therefore conclude that the transistor 25 is malfunctioning and should be replaced.

As an alternative to measuring the voltage, the current flowing in the branch in which the transistor 25 is arranged could be measured. When the test mode is applied the current should be reduced compared to the normal mode. If the test mode involves shutting the transistor off completely, the current should be close to 0 A, corresponding only to the leak current of the transistor.

The test mode should preferably be applied for a relatively short period of time. The test period must however be long enough to detect a significant change in the electrical characteristic. This means that the duration of the test period must be selected such that the value of the electrical characteristic will change so much that it exceeds the threshold value. The threshold value, in turn, should be selected such that the electrical characteristic will not reach the threshold value while in normal mode, but will reach the threshold value within a relatively short time in test mode, if the protection switch is malfunctioning.

In an alternative embodiment, where no threshold value is used, the value in test mode is compared to a value registered while in normal mode. In this case the duration of the test period must be long enough to enable a significant change in the electrical characteristic. This means that there must be time the value of the electrical characteristic in test mode to change to a value that may never occur in normal mode, when the protection switch is malfunctioning.

Figure 4:
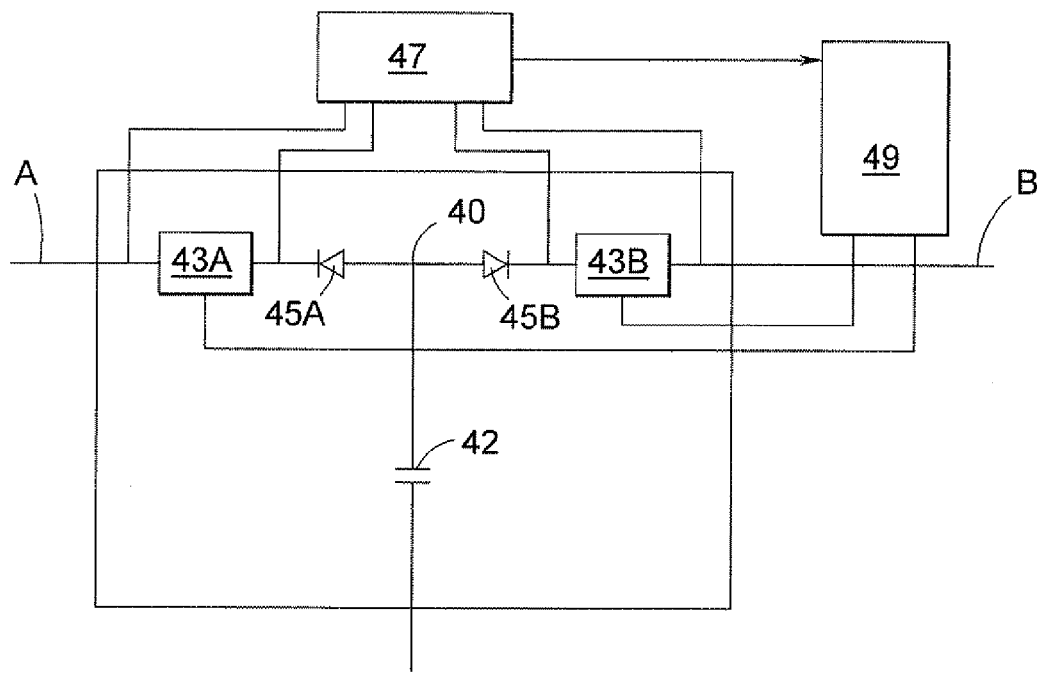
FIG. 4 illustrates the implementation of two circuit breakers according to the invention in a system having two branches, each with a separate power supply.

FIG. 4 illustrates a system having two power supplies A and B, in which a configuration such as the one shown in FIG. 2 may be used. This configuration is suitable for systems in which the currents are relatively low. The two branches are interconnected in a connection point 40. From the connection point 40 power is provided to a load (not shown), for example a telecommunications system, through a filter unit, illustrated here as a capacitor 42, for simplicity. On each branch there is a protection switch 43A, 43B, respectively. Between each protection switch and the connection point there is an ORing diode 45A, 45B, respectively. The use of ORing diodes for isolating redundant power sources is well known in the art. As the skilled person would realize any other suitable solution may be used instead of the ORing diodes 45A, 45B for isolating the branches A and B from each other.

The voltages across the protection switches 43A, 43B are monitored by a monitoring unit 47 and the information is provided to a control unit 49. The configuration for measuring the voltage may be as shown in FIG. 2. The capacitor 29 used in FIG. 2 for maintaining a voltage across the load is not needed in this case, because of the redundant power supply. The control unit 49 performs the same function as the control unit 27 of FIG. 2, that is, it controls the function each protection switch so as to place the protection switch in a test mode in which the protection switch will conduct to a lower degree than it does in the normal mode.

The monitoring unit or the control unit also has functions for evaluating the function of the protection switches 43A, 43B in test mode, by measuring the current and/or voltage in the respective branch. As explained above, when the protection switch is in test mode the current in the respective branch should be reduced compared to normal mode and the voltage compared to a reference voltage (not shown) should be lowered. If the current and/or the voltage are not reduced in the expected way the monitoring unit or the control unit will issue an alarm.

Figure 5:
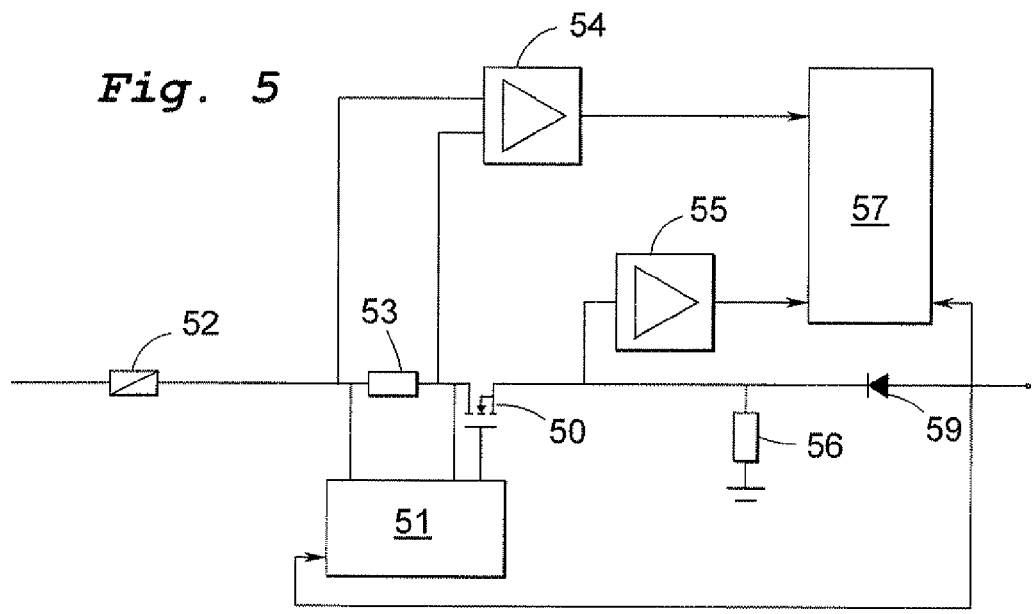
FIG. 5 illustrates in more detail one of the branches shown in FIG. 4.

FIG. 5 illustrates in more detail a possible configuration of one branch A or B as shown in FIG. 4.

In FIG. 5 the protection switching function is performed by a transistor 50 controlled by a control unit 51. A fuse 52, such as a mechanical fuse is arranged to provide a redundant fuse function. This fuse is optional. As in the previous examples, the control unit 51 is arranged to control the transistor 50 to operate most of the time in a normal mode in which the transistor is open. The control unit 51 is also arranged to place the transistor in a test mode in which the conductivity of the transistor is reduced compared to the normal mode. A resistor 53 is connected between the fuse 52 and the transistor 50. A voltage meter 54 is arranged to measure the voltage on both sides of the resistor 53. Hence the resistor 53 and the voltage meter constitute an ampere meter for measuring the current in the supply line. A voltage meter 55 is arranged to measure the voltage in the supply line. The voltage is measured relative to ground, that is across a second resistor 56. Only one of the ampere meter 53, 54 and the voltage meter 55 is needed. As discussed above, when the transistor 50 is in test mode the voltage and current in the supply line should drop. A monitoring unit 57 receives input from the ampere meter 53, 54 and/or the voltage meter 55 and evaluates the value of the current and/or the voltage during test mode compared to normal mode. The monitoring unit 57 is arranged to receive information from the control unit 51 when the transistor is in test mode. An ORing diode 59 is provided for isolation from the other branch as explained in connection with FIG. 4.

Figure 6:
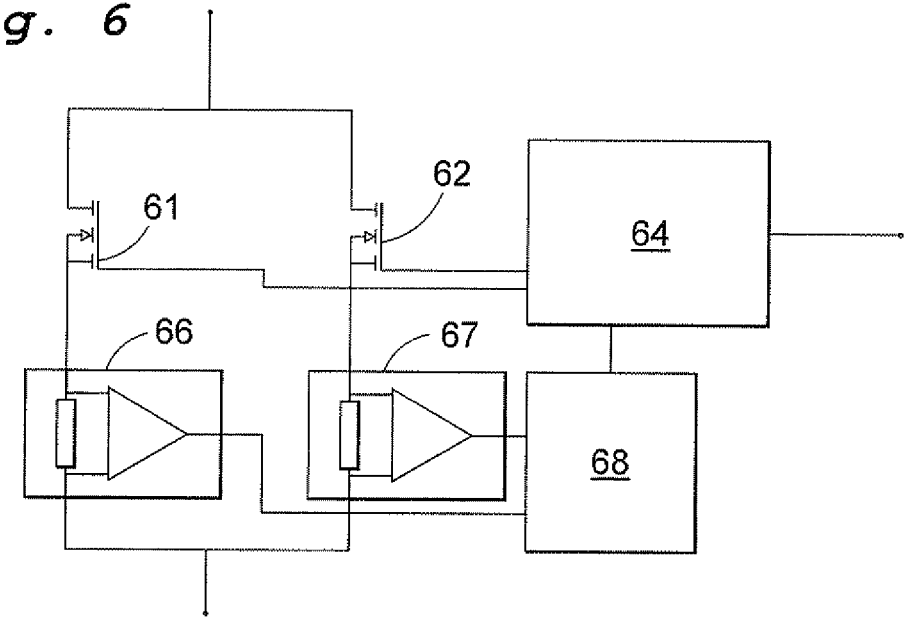
FIG. 6 illustrates an alternative embodiment of the invention, which is suitable for high currents.

FIG. 6 illustrates an alternative embodiment in which two transistors 61, 62 are arranged in parallel in the circuit breaker. The transistors are controlled by a control unit 64 arranged to place one or both transistors in a normal mode or a test mode in the same way as discussed above. In series with each of the transistors 61, 62, an ampere meter 66, 67, respectively, is arranged to measure the current through the transistor. The output signals from the ampere meters 66, 67 are fed to a monitoring unit 68. In this example, the monitoring unit should evaluate the current in test mode compared to a reference value in the same way as discussed in connection with FIG. 4. The test mode is preferably applied to one of the transistors 61, 62 at a time, but may also be applied to both transistors 61, 62 at the same time. The monitoring unit 68 receives information from the control unit 64 when the test mode is applied to one or both transistors to enable the monitoring unit 68 to perform measurements at the appropriate time. The monitoring unit 68 in turn preferably informs the control unit 64 about the test result. If the test mode shows that one or both transistors 61, 62 is malfunctioning, an alarm is issued, either by the monitoring unit 68 or by the control unit 64.

Figure 7:
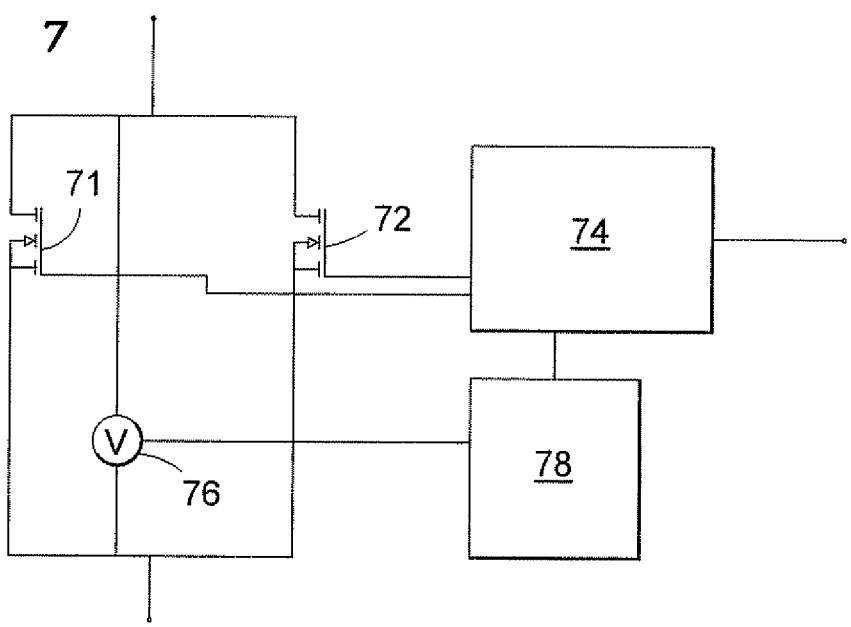
FIG. 7 illustrates another alternative embodiment of the invention which is suitable for high currents.

FIG. 7 shows an alternative embodiment. As in FIG. 6 two transistors 71, 72 are arranged in parallel in the circuit breaker. The transistors are controlled by a control unit 74 arranged to place one or both transistors 71, 72 in a normal mode or a test mode in the same way as discussed above. In parallel with the transistors a voltage meter 76 is arranged to measure the voltage across the branch, that is, the voltage between the drain and source, or collector and emitter of the transistors. A monitoring unit 78 is arranged to evaluate the voltage measured by the voltage meter 76 and compare the voltage when one or both transistors 71, 72 are in test mode to the voltage when both transistors are in normal mode.

In the example configuration shown in FIG. 7, the voltage in test mode should be compared to the actual voltage in normal mode. Therefore, preferably, the monitoring unit obtains from the voltage meter a value for the voltage shortly before the transistor is placed in test mode. This value is stored in the monitoring unit and compared to a voltage value obtained by the voltage meter when the transistor is in test mode. If the transistor in test mode is malfunctioning, this will result in an increased voltage measured by the voltage meter 76 because the resistance in the branch of the transistor being tested. If the voltage in test mode indicates a failure in one of the transistors, the monitoring unit 78 will issue an alarm or inform the control unit. In the latter case, the control unit will issue an alarm.

In the configurations shown in FIGS. 6 and 7, more than two transistors may be arranged in the same way. This will reduce the effect on the other branches when one branch is placed in test mode. In this case, one transistor or a group of transistors may be tested at the same time.

Figure 8:
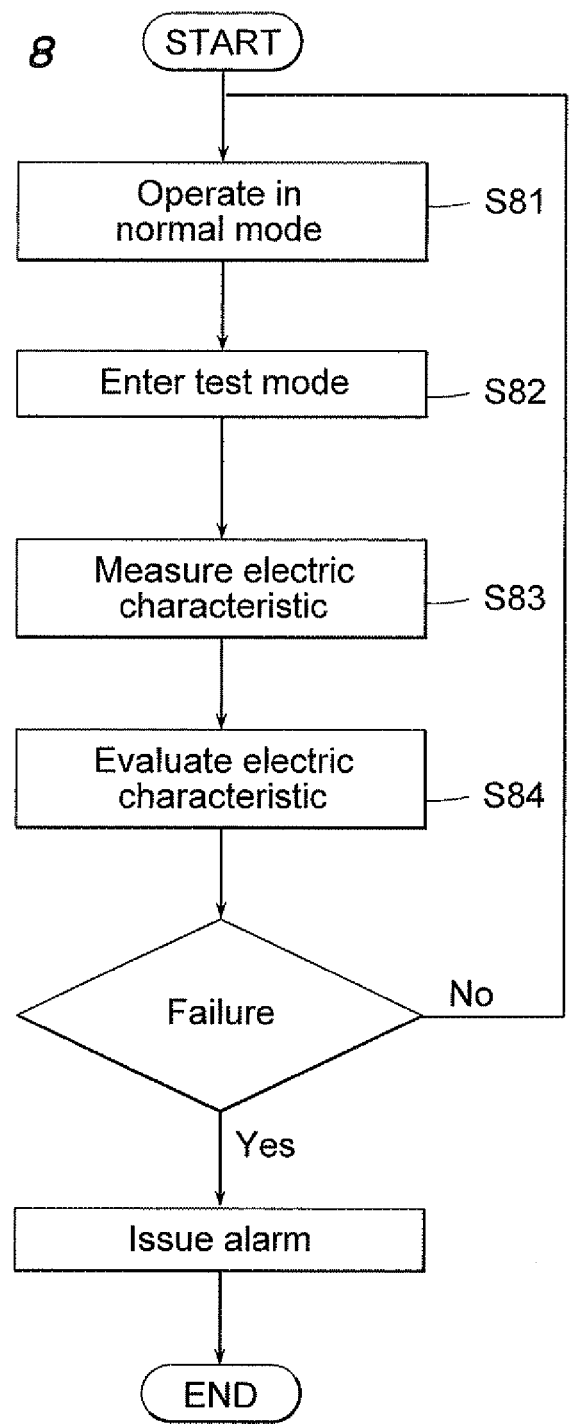
FIGS. 8 and 9 are flow charts of a first and a second embodiment respectively of a method according to the invention.

FIG. 8 is a flow chart of a method according to a first embodiment of the invention.

In step S81 the protection switch is operated in a normal mode in which it is fully conductive. That is, the controllable semiconductor is arranged to be open.

In step S82 the control unit controls the protection switch to enter a test mode in which the conductivity of the protection switch is blocked or reduced.

In step S83 an electrical characteristic, such as the current or the voltage is measured at a position in which it will be affected by the reduced conductivity of the protection switch and its value fed to a monitoring unit. Preferably, the control unit initiates the measurements when the protection switch has been placed in test mode.

In step S84 the monitoring unit evaluates the value of the electrical characteristic. This may be done by comparing it to a threshold value as discussed in connection with FIGS. 3*a* and 3*b*.

In step S85 the monitoring unit determines whether there is a failure in the protection switch. If there is a failure, an alarm is issued in step S86 by the control unit or the monitoring unit. If no failure is identified, the procedure returns to step S81. If an alarm is issued, an action should be taken. For example, service personnel should replace or repair the protection switch as soon as possible, or an automatic action should be taken, for example switching to a redundant system.

Figure 9:
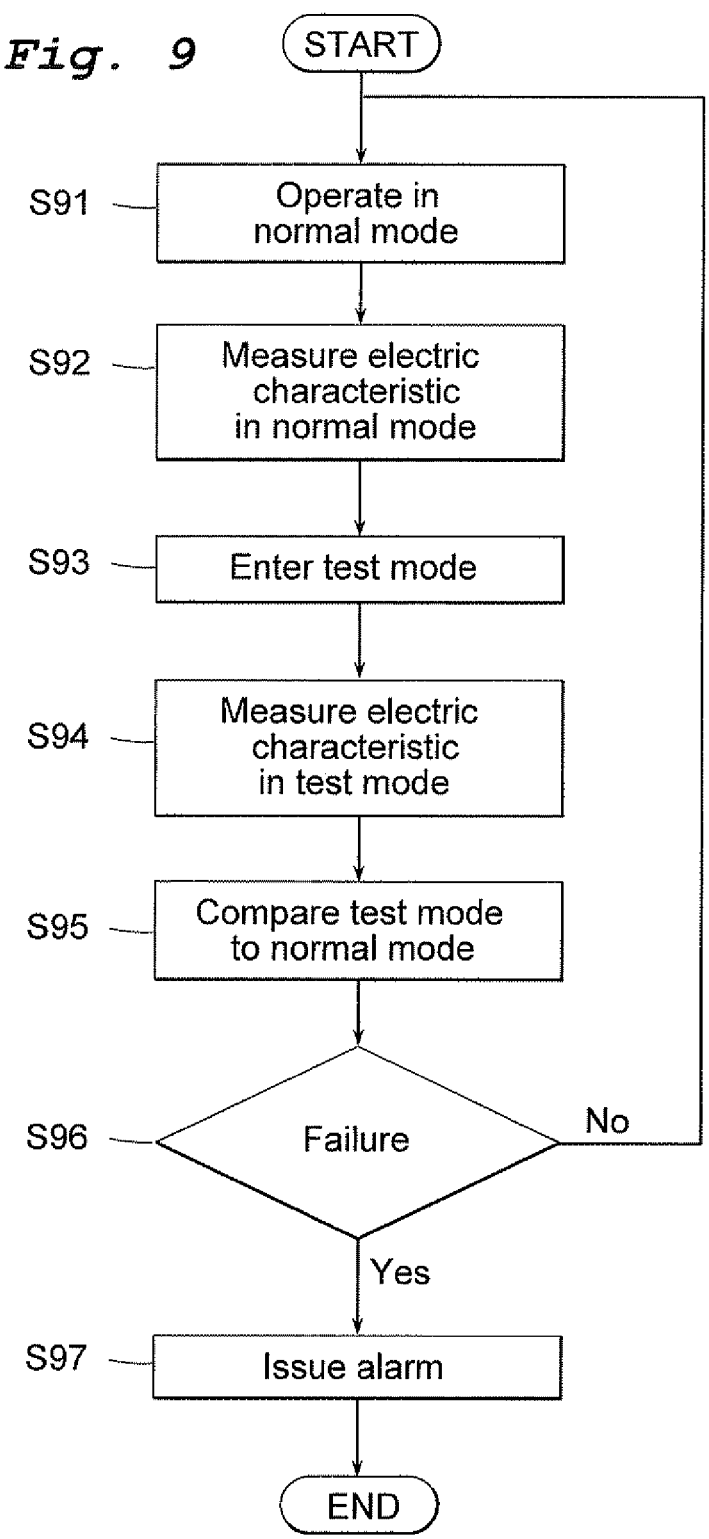

FIG. 9 is a flow chart of a method according to a second embodiment of the invention, in which the monitoring unit is a sample and hold unit arranged to store a current or voltage value registered during normal mode and compare it to a value registered in test mode.

In step S91 the protection switch is operated in a normal mode in which it is fully conductive. That is, the controllable semiconductor is arranged to be open.

In step S92 an electrical characteristic, such as the current or the voltage, is measured at a position in which it will be affected by the reduced conductivity of the protection switch and its value fed to a monitoring unit and stored there. Preferably, the control unit initiates the measurement before it places the protection switch in the test mode.

In step S93 the control unit controls the protection switch to enter a test mode in which the conductivity of the protection switch is blocked or reduced. The control unit initiates the measurements when the protection switch has been placed in test mode.

In step S94 the same electrical characteristic that was measured in step S92 is measured again and fed to the monitoring unit.

In step S95 the monitoring unit compares the values of the electrical characteristic in normal mode and in test mode.

In step S96 the monitoring unit determines whether there is a failure in the protection switch. If the difference between the normal mode and the test mode exceeds a certain value, it is determined that no failure is detected. If the value in test mode is too close to the value in normal mode it is determined that there is a failure in the protection switch If there is a failure an alarm is issued in step S97 by the control unit or the monitoring unit. If no failure is identified, the procedure returns to step S91. If an alarm is issued, service personnel should replace or repair the protection switch as soon as possible. Alternatively, as mentioned above, an automatic action may be performed, for example, switching to a redundant system.

The invention claimed is:

1. An electronic circuit breaker for use in a power supply distribution system, comprising:
   at least one protection switch in the form of a controllable semiconductor arranged to conduct current through the power supply line in a normal mode and to limit the current if an error occurs which causes the current to increase above an upper threshold level,
   a control unit arranged to control the at least one protection switch to enter a test mode in which the current through the at least one protection switch is reduced compared to the normal mode,
   a registration unit arranged to register during test mode a test mode value of at least one electrical characteristic in the power supply line that will be affected when the test mode is applied, and
   a monitoring unit arranged to evaluate the at least one electrical characteristic and determine, based on the evaluation, whether or not the protection switch is malfunctioning and to take an action if it is determined that the protection switch is malfunctioning, wherein
   the registration unit is arranged to register a normal mode value of the at least one electrical characteristic during normal mode and the monitoring unit is arranged to evaluate the electrical characteristic by comparing the test mode value to the normal mode value.

2. The electronic circuit breaker according to claim 1, further comprising an alarm unit arranged to receive information from the monitoring unit regarding the value of the electrical characteristic while in test mode.

3. The electronic circuit breaker according to claim 1, wherein the monitoring unit is arranged to evaluate the at least one electrical characteristic by comparing it to a threshold value (T).

4. The electronic circuit breaker according to claim 1, wherein the registration unit includes at least one resistor and a voltage meter for measuring the voltage across the resistor.

5. The electronic circuit breaker according to claim 1, wherein the registration unit includes an ampere meter for measuring the current through the power supply line.

6. An electronic circuit breaker module, comprising:
   a first branch comprising a first electronic circuit breaker,
   a second branch comprising a second electronic circuit breaker, and
   a controller arranged to control both the first and the second electronic circuit breaker, wherein
   the first electronic circuit breaker comprises:
      at least one protection switch in the form of a controllable semiconductor arranged to conduct current through the power supply line in a normal mode and to limit the current if an error occurs which causes the current to increase above an upper threshold level, a control unit arranged to control the at least one protection switch to enter a test mode in which the current through the at least one protection switch is reduced compared to the normal mode, a registration unit arranged to register during test mode a test mode value of at least one electrical characteristic in the power supply line that will be affected when the test mode is applied, and a monitoring unit arranged to evaluate the at least one electrical characteristic and determine, based on the evaluation, whether or not the protection switch is malfunctioning and to take an action if it is determined that the protection switch is malfunctioning, the registration unit is arranged to measure the electrical characteristic for each of the first and second branch, wherein the registration unit is further arranged to register a normal mode value of the at least one electrical characteristic during normal mode and the monitoring unit is arranged to evaluate the electrical characteristic by comparing the test mode value to the normal mode value.

7. The electronic circuit breaker module according to claim 6, wherein the controller is arranged to place the first and the second electronic circuit breaker in test mode at different times.

8. A telecommunications system having a power supply including at least one rectifier arranged to provide a DC voltage to a number of printed board assemblies through at least one fuse, wherein the at least one fuse comprises an electronic circuit breaker comprising:

at least one protection switch in the form of a controllable semiconductor arranged to conduct current through the power supply line in a normal mode and to limit the current if an error occurs which causes the current to increase above an upper threshold level, a control unit arranged to control the at least one protection switch to enter a test mode in which the current through the at least one protection switch is reduced compared to the normal mode, a registration unit arranged to register during test mode a test mode value of at least one electrical characteristic in the power supply line that will be affected when the test mode is applied, and a monitoring unit arranged to evaluate the at least one electrical characteristic and determine, based on the evaluation, whether or not the protection switch is malfunctioning and to take an action if it is determined that the protection switch is malfunctioning, wherein the registration unit is further arranged to register a normal mode value of the at least one electrical characteristic during normal mode and the monitoring unit is arranged to evaluate the electrical characteristic by comparing the test mode value to the normal mode value.

9. A printed board assembly comprising a printed circuit board having a power input and a number of electrical components thereon, wherein it comprises an electronic circuit breaker arranged to function as a protection switch on the power input to said printed board assembly, wherein the electronic circuit breaker comprises:

at least one protection switch in the form of a controllable semiconductor arranged to conduct current through the power supply line in a normal mode and to limit the current if an error occurs which causes the current to increase above an upper threshold level, a control unit arranged to control the at least one protection switch to enter a test mode in which the current through the at least one protection switch is reduced compared to the normal mode, a registration unit arranged to register during test mode a test mode value of at least one electrical characteristic in the power supply line that will be affected when the test mode is applied, and a monitoring unit arranged to evaluate the at least one electrical characteristic and determine, based on the evaluation, whether or not the protection switch is malfunctioning and to take an action if it is determined that the protection switch is malfunctioning, wherein the registration unit is further arranged to register a normal mode value of the at least one electrical characteristic during normal mode and the monitoring unit is arranged to evaluate the electrical characteristic by comparing the test mode value to the normal mode value.

10. A method for providing protection switching in a power supply line having at least one protection switch in the form of a controllable semiconductor arranged in it, the at least one protection switch being arranged to conduct current through the power supply line in a normal mode and to limit the current if an error occurs which causes the current to increase above an upper threshold level, the method comprising:

causing the at least one protection switch to enter a test mode in which the conducting capacity of the at least one protection switch is reduced compared to the normal mode, registering in test mode at least one electrical characteristic in the power supply line that will be affected when the test mode is applied, evaluating the at least one electrical characteristic and determining, based on the evaluation, whether or not the protection switch is malfunctioning, taking an action if it is determined that the protection switch is malfunctioning, and registering the at least one electrical characteristic in normal mode before entering test mode, wherein the step of evaluating comprises comparing the values of the electrical characteristic in test mode and in normal mode.

11. The method according to claim 10, wherein the evaluation step comprises comparing the at least one electrical characteristic to a threshold value (T).

12. The method according to claim 10, wherein the registration step includes measuring a voltage.

13. The method according to claim 10, wherein the registration step includes measuring the current through the power supply line.

* * * * *